(12) United States Patent
Drexler

(10) Patent No.: US 7,424,635 B2
(45) Date of Patent: *Sep. 9, 2008

(54) SYSTEM AND METHOD FOR POWER SAVING DELAY LOCKED LOOP CONTROL BY SELECTIVELY LOCKING DELAY INTERVAL

(75) Inventor: Adrian J. Drexler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 323 days.

This patent is subject to a terminal disclaimer.

(21) Appl. No.: 11/297,087

(22) Filed: Dec. 7, 2005

(65) Prior Publication Data

US 2006/0143489 A1   Jun. 29, 2006

Related U.S. Application Data

(63) Continuation of application No. 10/074,296, filed on Feb. 11, 2002, now Pat. No. 6,988,218.

(51) Int. Cl.
*G06F 1/04* (2006.01)

(52) U.S. Cl. .................... 713/401; 713/600

(58) Field of Classification Search ............ 713/401, 713/600

See application file for complete search history.

(56) References Cited

U.S. PATENT DOCUMENTS

| | | | |
|---|---|---|---|
| 5,675,274 A | 10/1997 | Kobayashi et al. | 327/158 |
| 5,708,611 A | 1/1998 | Iwamoto et al. | 365/195 |
| 6,108,793 A | 8/2000 | Fujii et al. | 713/400 |
| 6,111,925 A | 8/2000 | Chi | 375/354 |
| 6,215,363 B1 | 4/2001 | Conta et al. | 331/17 |
| 6,249,685 B1 | 6/2001 | Sharaf et al. | 455/550 |
| 6,252,466 B1 | 6/2001 | Kawamura | 331/25 |
| 6,265,947 B1 | 7/2001 | Klemmer et al. | 331/17 |
| 6,385,125 B1 | 5/2002 | Ooishi et al. | 365/233 |
| 6,438,060 B1 * | 8/2002 | Li et al. | 365/227 |
| 6,486,651 B1 | 11/2002 | Lee et al. | 365/227 |
| 6,525,988 B2 | 2/2003 | Ryu et al. | 365/233 |
| 6,538,956 B2 | 3/2003 | Ryu et al. | 365/233 |
| 2002/0181296 A1 | 12/2002 | Jones et al. | 365/194 |

* cited by examiner

*Primary Examiner*—Chun Cao
(74) *Attorney, Agent, or Firm*—Dorsey & Whitney LLP

(57) ABSTRACT

The delay locked loop ("DLL") delay interval can be locked to stop the DLL from wasting power in unnecessarily switching to synchronize the device with the DLL is associated to the system clock. This is achieved by adding logic sensing when a DRAM device will not imminently be called upon to output data and when the device has stabilized. Waiting for the DLL delay interval to stabilize before locking the delay interval still allows the DLL to immediately and effectively resume operations when the DLL is needed to synchronize the output of the DRAM device with the system clock. The DLL delay interval can be locked, together with the DLL clock, after the DRAM device is deselected by the chip select control line, after a number of no operation commands have been received, and/or after any command issued to the DRAM device has been completed.

25 Claims, 4 Drawing Sheets ically, the switching of the many devices causes fluctuations in the supply voltage to the circuit, which in turn affects the supply voltage available to the devices and thereby affects the phase of the clock pulses. Literally, as a circuit becomes sufficiently complex, it becomes virtually impossible for a single clock source to pulse the entire circuit; switching of devices pulsed by that clock source creates such a large current drain on the clock source that it can become impossible for the clock source to maintain a clock signal having a consistent phase. Thus, as a circuit grows in complexity, it becomes necessary to add devices merely to proliferate clock signals with an adequate current to source to dependent devices.

SYSTEM AND METHOD FOR POWER SAVING DELAY LOCKED LOOP CONTROL BY SELECTIVELY LOCKING DELAY INTERVAL

This application is a continuation of U.S. patent application No. 10/074,296, filed Feb. 11, 2002, now U.S. Pat. No. 6,988,218.

TECHNICAL FIELD

The present invention is directed to random access memory ("RAM") devices and other devices employing delay locked look ("DLL") subsystems. More particularly, the present invention is directed to a system and method allowing devices employing DLL subsystems to save power when the DLL subsystem is not needed.

BACKGROUND OF THE INVENTION

In an era when microprocessors and supporting devices are commonly rated at gigahertz clock speeds, the synchronization in timing between digital devices becomes ever more critical. At high speeds, even the propagation time required for a signal traveling from one digital device to another, or even from one part of a digital device to another part of the same device, becomes both a design and operational concern. Moreover, at such high speeds, concerns arise not only from the possibility of data taking too long to become available at a certain point in a device, but also from the possibility that data may be available too soon. Because digital devices operate at different speeds, it is clearly vital that devices disposed to operate in concert actually are synchronized in their operations. If one digital device were, for example, to be operating one clock pulse ahead or behind a storage device from which the device receives data, the results generated by the device might be based on erroneous operands.

As a digital system grows in size, complexity, and number of devices it comprises, the effect of the heat generated by the devices affects the regularity of the phase of the clock signal. Similarly, the switching of the many devices causes fluctuations in the supply voltage to the circuit, which in turn affects the supply voltage available to the devices and thereby affects the phase of the clock pulses. Literally, as a circuit becomes sufficiently complex, it becomes virtually impossible for a single clock source to pulse the entire circuit; switching of devices pulsed by that clock source creates such a large current drain on the clock source that it can become impossible for the clock source to maintain a clock signal having a consistent phase. Thus, as a circuit grows in complexity, it becomes necessary to add devices merely to proliferate clock signals with an adequate current to source to dependent devices.

Introduction of devices to proliferate these clock signals, however, introduces a competing concern: to avoid the very lack of timing synchronization these devices are introduced to correct. With continual changes in voltage and operating temperature, the outputs of these proliferation devices must be checked and synchronized to ensure that all the devices in the circuit operate with acceptable synchronization.

Various means have been used to proliferate synchronized clock signals in large circuits. One of these, a delay locked loop ("DLL") subsystem, has proven to be a very workable and popular solution. Generally, a DLL includes its own clocking device synchronized to that of a system clock input. The DLL maintains its synchronization to the system clock through a network of digital delay devices which allow the DLL to apply a positive or negative delay to its clock signal to generate an output signal appropriately synchronized to the input signal. As the "loop" designation implies, the DLL monitors a feedback loop of its own output clock signal and compares it to an input clock signal—that of the system clock—to adjust the DLL output to keep it in phase with system clock.

DLL subsystems have proven to be very useful in random access memory ("RAM") devices in proliferating a system clock to synchronize the timing with which the data is read from the RAM device. Specifically, the DLL clocks output drivers of the RAM device to apply data to data bus terminals of the RAM device. The DLL in a RAM device monitors the system clock signal received by the RAM device and continually synchronizes its own clock signal output so that data is read from the RAM device in synchronism with the system clock signal. As is known in the art, the DLL incorporates a number of delay elements which can be switched as needed to effect the proper delay to synchronize the output of the RAM device with the appropriate edges of the system clock signal. As noted, the DLL monitors the system clock signal and is thus immune to variations in operating temperature and fluctuations in device supply voltage which could disrupt its synchronization with the system clock. As a result, data stored in the RAM device is read from the RAM device at the appropriate time.

However, as more and more subsystems are introduced to the RAM device, including subsystems like the DLL which are employed merely to support the function of other devices, the power consumption of the RAM device can become extensive. This power consumption can generate excessive heat, which generally is undesirable for many reasons, not the least of which is the effect that introduction of additional heat has on maintaining a regular clock signal, as previously described.

A greater concern in adding additional devices is magnified by the increasing popularity of portable digital devices, evident by the proliferation of portable computers, digital wireless telephones, personal digital assistants, digital music players, and similar devices. As users come to depend on these devices more and more, users need to be able to operate these devices for longer periods of time on a single charge or set of batteries. Although power source technology has improved, arguably, still the most significant measure that can be taken to increase battery life is to reduce the power consumed by these devices.

One of the clearest ways for such a device to save power is to shut down subsystems that are not in use. To take one example, when a user puts a portable computer in a standby mode, many devices in the system, ranging from the display and the circuits which support it, to the input-output devices and the circuits which support them, are shut down. Similarly, portable computers and other devices commonly can be programmed to power themselves down to a standby mode when no user or system commands have been issued during the passage of a preselected period of nonuse. Obviously, some systems cannot be shut down without obliterating the usefulness of the information; most notably, RAM devices must continue to receive power, or their contents will be lost. Further, as is known in the art, the memory cells of dynamic random access memory ("DRAM") devices must be regularly refreshed to preserve the integrity of their contents.

In a power-saving standby mode, these DRAM devices typically enter a self-refresh mode in which their contents are refreshed at the direction of an onboard self-refresh controller and clock. The onboard self-refresh control systems exploit the fact that the lack of external commands places DRAM devices in a reasonably stable state. Because the self-refresh state comprises a continual cycle of refresh commands, without sporadic system commands being received, current leakage that degrades the ability for DRAM memory cells to maintain their contents is reduced. As a result, the self-refresh control systems can employ a longer interval between row refreshes, thereby saving power.

Data is not read from a DRAM device when it is in a self-refresh mode. Consequently, there is no need for the DLL subsystem to constantly synchronize its delay interval to that of the system clock during the self-refresh mode. It is known in the art that the DLL subsystem can be locked upon the DRAM device entering a self-refresh state. More precisely, the delay interval used by the DLL subsystem is locked upon the DRAM device entering the self-refresh state.

FIG. 1 depicts a conventional DRAM device 100, directed by control logic 105, with a DLL subsystem 110. Specifically, a self-refresh command is triggered by the system driving the RAS* 120 (row address strobe—low enable) and the CAS* 130 (column address strobe—low enable) control lines low, and by also driving the CKE 140 (clock enable) control line low. This command causes the self-refresh control logic to periodically and repeatedly refresh every one of its rows, and also places all the control lines into a "don't care" state, with the exception of the CKE 140 control line. The self-refresh state ends when the CKE 140 control line is driven high. At that point, after a waiting interval described below, the system can then access the DRAM device for read and write operations and/or to control the refreshing of the DRAM device through auto-refresh commands. Existing DRAM devices recognize that, when the CKE 140 control line is driven low, the DLL 110 subsystem can be disabled to save the power that would be wasted in its devices switching to synchronize its own clock output with that of the system clock supplied to the DRAM device 100 at the CK 150 (clock—low) and CK 160 (clock) inputs.

It is also known that, to enable the DLL 110 to function effectively upon the DRAM device 100 exiting self-refresh state when the CKE 140 control line is driven high, that the delay interval employed by the DLL 110 should be "frozen" at the delay state employed at the time the CKE 140 control line was driven low. Freezing the delay interval makes it possible for the DLL 110 to clock the DRAM device 100 without an extended delay or startup interval having to be afforded the DRAM device 100 upon it exiting self-refresh mode. Freezing the delay interval, basically, allows the DLL 110 to pick up where it left off when the self-refresh mode was entered, giving the DLL 110 a head start in achieving synchronization with the system clock. As a result, some power is saved by preventing DLL 110 switching when the DLL 110 is not needed during self-refresh mode.

Other than during self-refresh states, there are other times that a DRAM device 100 will not need not be actively outputting data, and, therefore, it is not necessary for the DLL 110 to constantly be switching to fine tune its synchronization with the system clock. Thus, it is conceivable that power potentially wasted on needless switching of the DLL 110 might be further saved during these times. It is to this end that the present invention is directed.

SUMMARY OF THE INVENTION

Through the addition of logic sensing when a DRAM device will not imminently be called upon to output data and allow an appropriate delay interval for the DLL delay interval to stabilize, the DLL delay interval can be locked to stop the DLL from wasting power in unnecessarily switching to synchronize with the system clock. However, waiting for the DLL delay interval to stabilize before locking the delay interval better allows the DLL to immediately and effectively resume operations when the DLL is needed to synchronize the output of the DRAM device with the system clock. The delay interval can be locked after the DRAM device is deselected by the chip select control line or after a number of no operation commands have been received and once any command issued to the DRAM device has completed its propagation through the DRAM device to allow the delay interval to stabilize. In addition, more power can be saved during these times by deactivating the DLL clock mechanism when the DLL is not needed.

DETAILED DESCRIPTION OF THE INVENTION

In addition to when the DRAM device 100 (FIG. 1) is in self-refresh mode, there are other times when power ordinarily wasted on DLL 110 switching might be saved. The DRAM device 100, may be in an operational mode but still neither reading nor writing data, nor being auto-refreshed by the system. For example, the DLL 110 need not be actively synchronizing the output of the DRAM device 100 when the DRAM device is "deselected." The DRAM device 100 is deselected when the CS* 170 (chip select—low enable) control line is driven high, which signals the DRAM device 100 will not be used to provide data until such time as the CS* 170 control line is once more driven low. Comparably, the DRAM device 100 might "infer" that it will not imminently be called upon to read or write data when the DRAM device 100 has received a number of sequential NOP or "no operation" commands. Depending on whether the system clock speed is slower or faster, after receiving two or three NOP commands, respectively, it might be inferred the system tacitly has deselected the device. In either case, once a command has completely propagated through the DRAM device 100, the supply voltage across the DRAM device 100 stabilizes, which in turn allows the DLL delay interval to stabilize. At that point, if no data is being written to or received by the DRAM device, and there is no need for the DLL 110 to continue switching to fine tune its synchronization with the system clock. At all these times, the delay interval used by the DLL 110 can be locked so that the DLL can immediately resume operation on demand, but without wasting power in continually switching to synchronize its output with that of the system clock when it is not necessary to do so.

Figure 1:
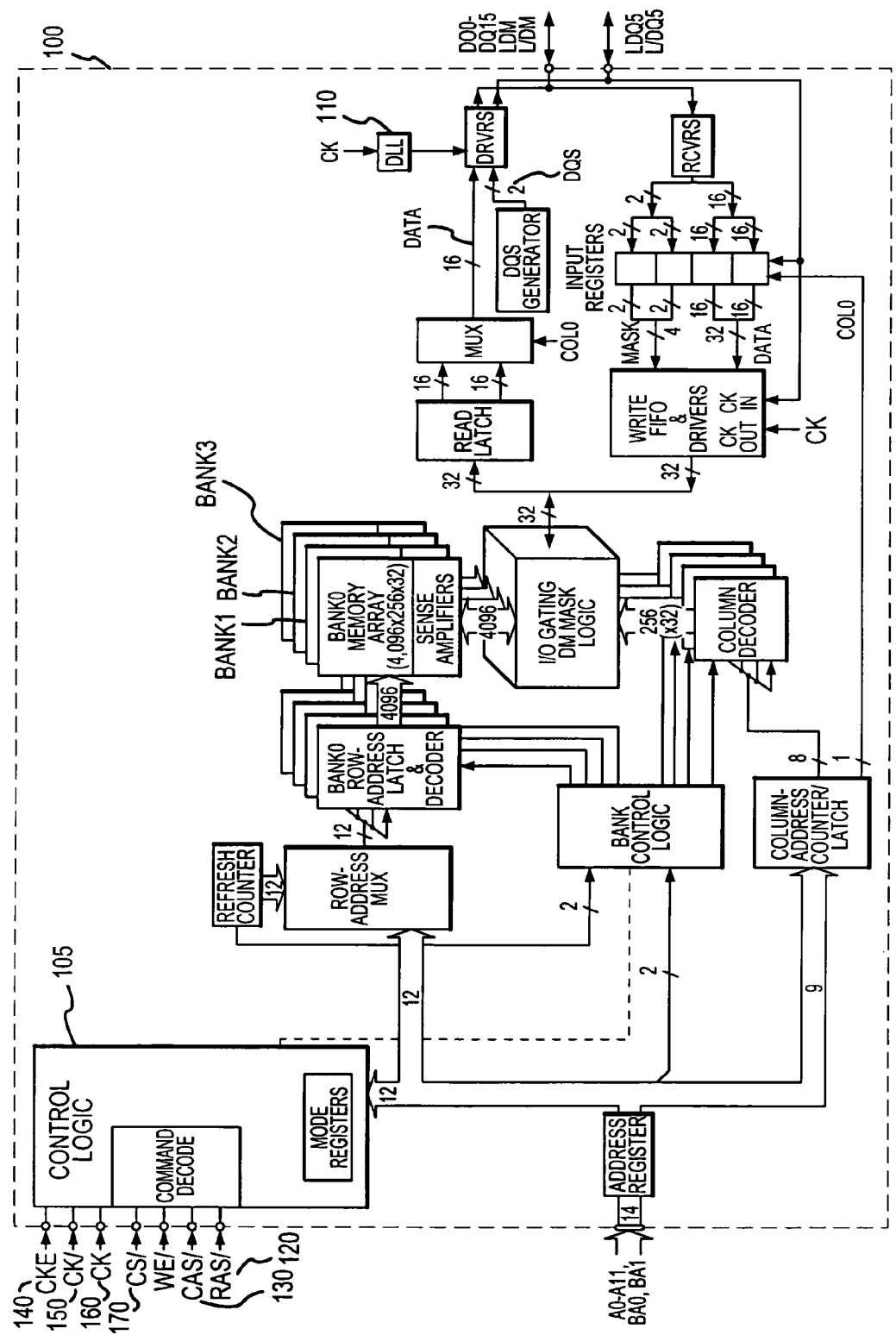
FIG. 1 is a block diagram of a conventional DRAM device equipped with a DLL subsystem.
Figure 2:
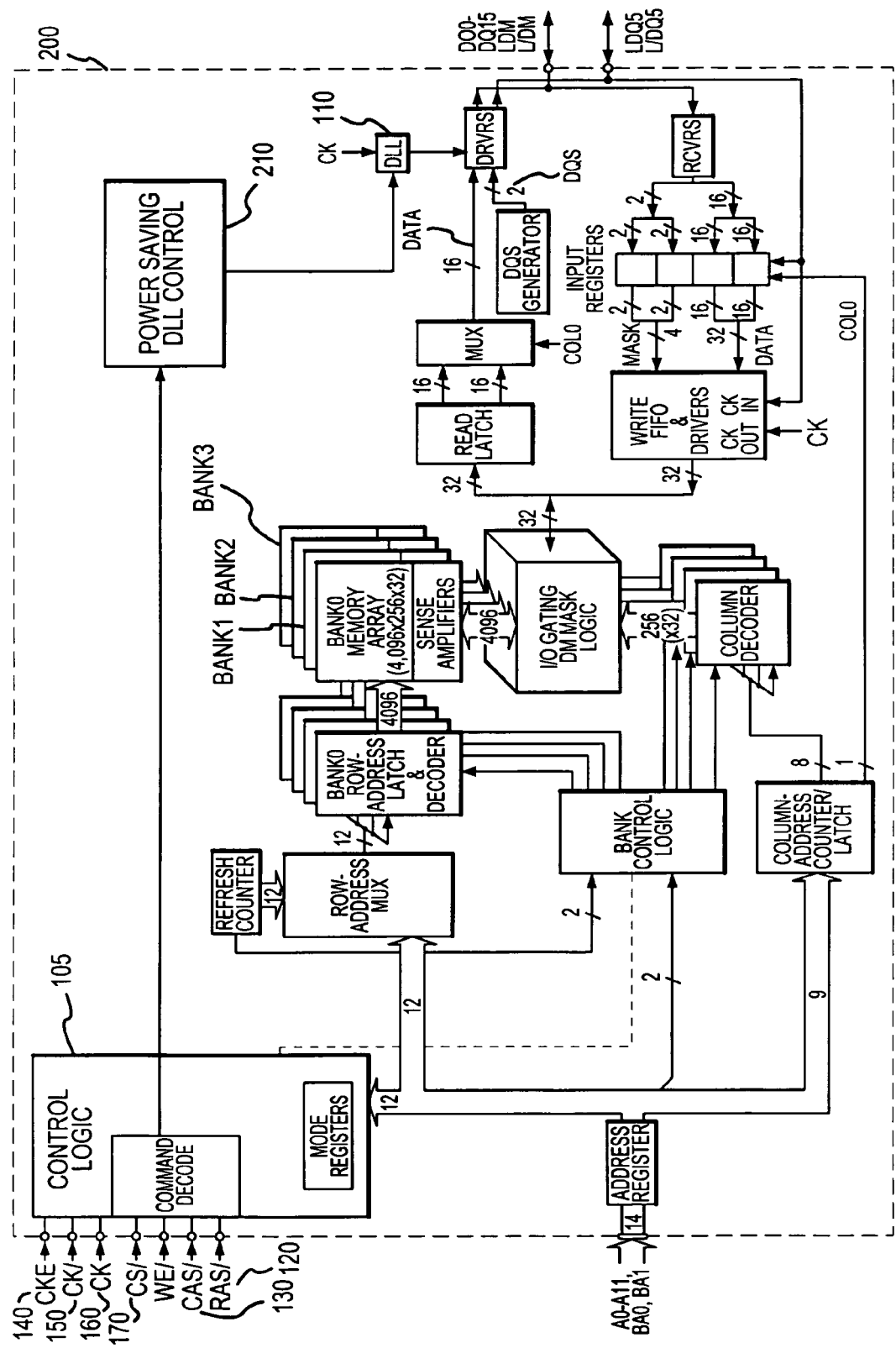
FIG. 2 is a block diagram of a DRAM device equipped with an embodiment of the present invention.

FIG. 2 is block diagram of a DRAM device 200 equipped with a preferred embodiment of the present invention. The DRAM device 200 includes all of the same components used in the DRAM device 100 of FIG. 1. Therefore, in the interest of brevity, these components have been provided with the same reference numerals, and an explanation of their functions and operations will not be repeated. The main difference between the DRAM device 200 depicted in FIG. 2 and the prior art DRAM device 100 depicted in FIG. 1 is that the DRAM device 200 incorporates the power saving DLL control 210 according to one embodiment of the invention. As shown in FIG. 2, the power saving DLL control is directly responsive to commands applied to the control logic 105, and controls the DLL 110.

Functionally, the power saving DLL control 210 monitors the functions of the DRAM device 200, and, in accordance with the foregoing discussion, locks the DLL delay interval when the DLL 110 is not required to switch to maintain synchronization with the system clock and that delay interval has stabilized. In brief, the power saving DLL control 210 is responsive to states when it is not necessary for the DLL 110 to switch, such as when the DRAM device has been deselected by the CS* control line being driven high, or when the device has received a series of NOP commands. In these situations, the power saving DLL control 210 waits for the supply voltage in the DRAM device 200 and, correspondingly, for the DLL delay interval to stabilize, at the point the last command has been completed and the effects of that command have propagated all the way through the DRAM device 200. At that moment, the power saving DLL control 210 locks the stabilized delay interval in use. In a preferred embodiment, the power saving DLL control 210 also disables the DLL's clocking device; if the DLL 110 is not needed to synchronize the timing of the DRAM device 200 with the system clock, then the DLL clock is not needed either.

Benefits of the preferred embodiment of the present invention become more clear as compared to what would happen if the DLL 110 were simply to be powered down. Powering off the DLL, at least, would require a start-up delay when the DLL 110 was reactivated; it would probably require a number of clock pulses of the system clock in order for the DLL 110 to resynchronize its timing—and that of the DRAM device it serves—with the system clock. Again, in an era where devices operate and are expected to operate in the gigahertz range, anything that adds delays in system operation is at least undesirable, and possibly entirely unacceptable. Today it is fairly common to have a computing system with a large system memory hundreds of megabytes in size. It is entirely foreseeable that several DRAM devices in a system of many more DRAM devices frequently might receive a series of NOP commands. Deactivating the DLL altogether in at attempt to save power would achieve that objective; however, every time, potentially thousands of times per second when the DLL subsystem was reactivated, delays in restarting and resynchronizing the DLL subsystem would waste a significant amount of time.

By contrast, embodiments of the present invention balance power savings without adding such delays. By locking in the delay interval in place once the DRAM device stabilizes allows the DLL to, literally, pick up where it left off. If the DLL were to continue operating normally, the next command that affected the DRAM device would have created a synchronization lapse between the system clock and the DLL, even though the DLL had reached a point of stability at which the delay would remain fairly constant. Because of this synchronization lapse, the DLL would be required to switch its delay devices to reestablish synchronization. This exact same phenomenon results in the preferred embodiment: the DLL, called upon to resynchronize with a once again active system will start switching to regain synchronization, starting from the stabilized delay interval that was locked in by application of the preferred embodiment. The only difference between a system where the DLL continues to operate unabated and a DLL equipped with a preferred embodiment of the present invention is that the later saves power, and without wasted startup intervals that would be required if the DLL were powered down altogether.

Figure 3:
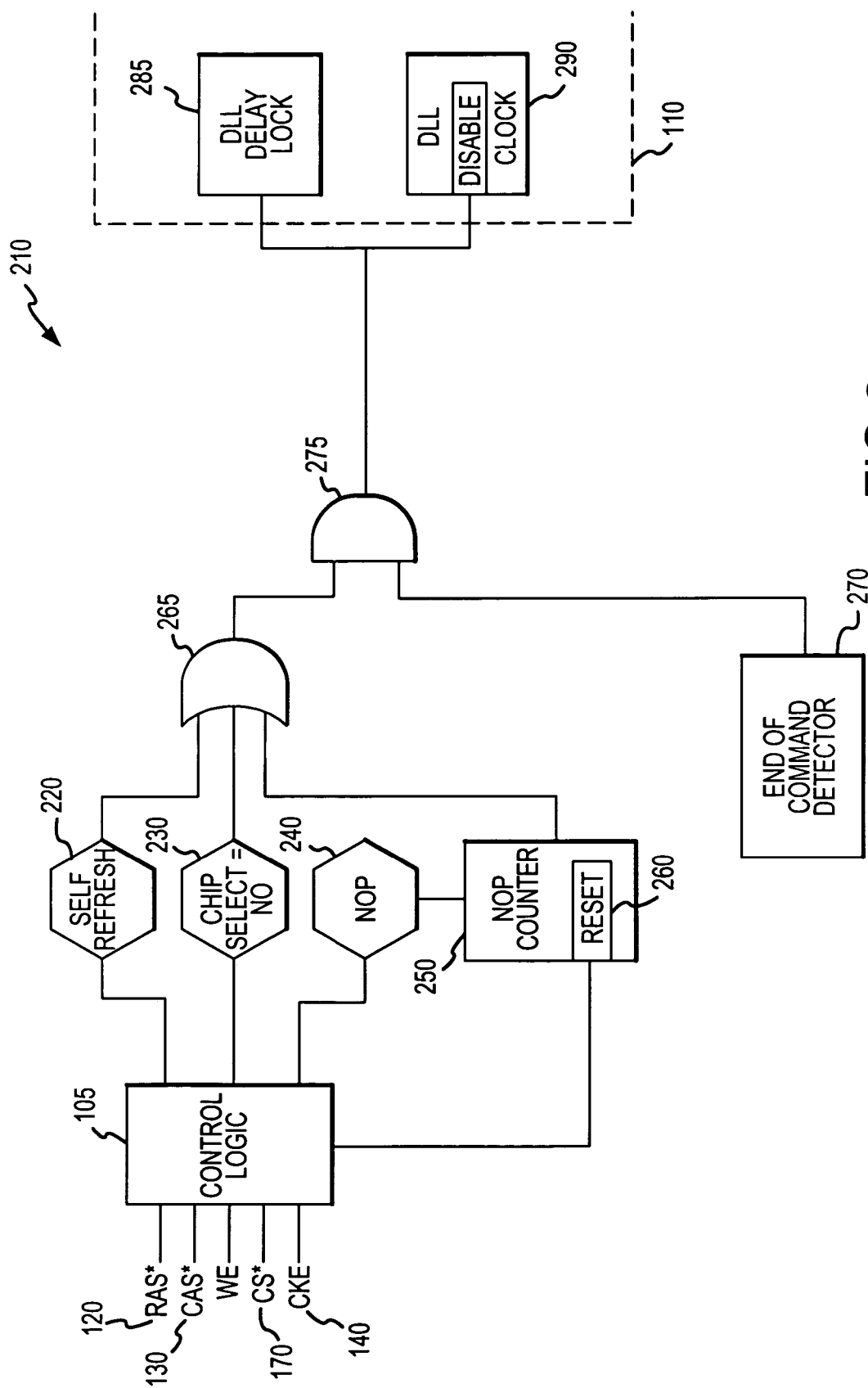
FIG. 3 is a block diagram of an embodiment of the present invention to save power by locking the DLL delay interval and/or disable the DLL clock.

FIG. 3 is a block diagram illustrating a preferred embodiment of the power saving DLL control 210 that would allow for DLL power savings in a number of situations. Once more, in the interest of brevity, elements in FIG. 3 that are common with elements in preceding figures have been provided with the same reference numerals, and an explanation of their functions and operations will not be repeated.

The power saving DLL control 210 may be used in a DRAM device directed by control logic 105 which receives and decodes commands represented by signals received at control lines 120-140, including RAS* 120, CAS* 130, CKE* 150, and CS* 170. The embodiment shown graphically depicts the control logic 105 issuing three different commands, self-refresh commands 220, chip deselect commands 230, and NOP commands 240. Obviously, there are other commands which might be generated by the control logic, such as read, write, and auto-refresh commands. However, in the embodiment shown, only self-refresh 210, chip deselect 230, and NOP 240 commands are relevant. Also, the power saving DLL control 210 may be used with DRAMs having control signals other than RAS*, CAS*, CKE*, and CS*.

Issuance of any of these three commands can activate the power saving DLL control 210, although a number of NOP 240 commands must be issued to actually lock the DLL delay interval. Signals representing the self-refresh 220 command, the chip deselect 230 command, and the output of a NOP counter 250, which overflows and triggers its output signal once the NOP counter 259 has received a predetermined number of NOP 240 commands in sequence, are fed into a logical OR gate 265. It will be appreciated that the NOP counter 250 has a reset control 260 which resets the NOP 240 command count to zero each time a command other than a NOP 240 command is received. As a result, the NOP counter 250 will reach overflow only when a predetermined number of NOP 240 commands have been received in sequence. The OR gate 265 reflects that issuance of any one of these eventualities will activate the power saving DLL control 210.

The output of this OR gate 265 is applied to a logical AND 275 gate along with the output of an end of command detector 270. As previously described, a beneficial aspect of embodiments of the present invention is that the delay interval is locked only once the delay interval has stabilized, which occurs after the command applied to the control lines 120-140 has propagated through the entire DRAM device 200 (FIG. 2). Accordingly, it is only once the command has finished propagating, as detected by the end of command detector 270, combined with issuance of a self-refresh 220, chip deselect 230, or series of NOP 240 commands, that the power saving DLL control 210 becomes active. The end of command detector 270 may determine when the DRAM device 200 (FIG. 2) has stabilized by allowing a predetermined time interval to pass after receipt of the last command, or by monitoring changes in the supply voltage across the DRAM device 200 (FIG. 2).

Once output of the AND gate 275 is driven high, the power saving DLL control 210 initiates power savings in the DLL subsystem 110. Specifically, in a preferred embodiment of the present invention, the output of the AND gate 275 being driven high affects two aspects of the DLL subsystem 110. First, a high signal from the AND gate 275 activates the DLL delay lock 285 to freeze or lock the stabilized delay interval. Second, a high signal from the AND gate 275 can be applied to the DLL clock 290 to freeze it, as well. As is the case in stopping the DLL 110 from switching its delay interval, stopping the DLL clock 290 from pulsing saves power which otherwise would be wasted.

Figure 4:
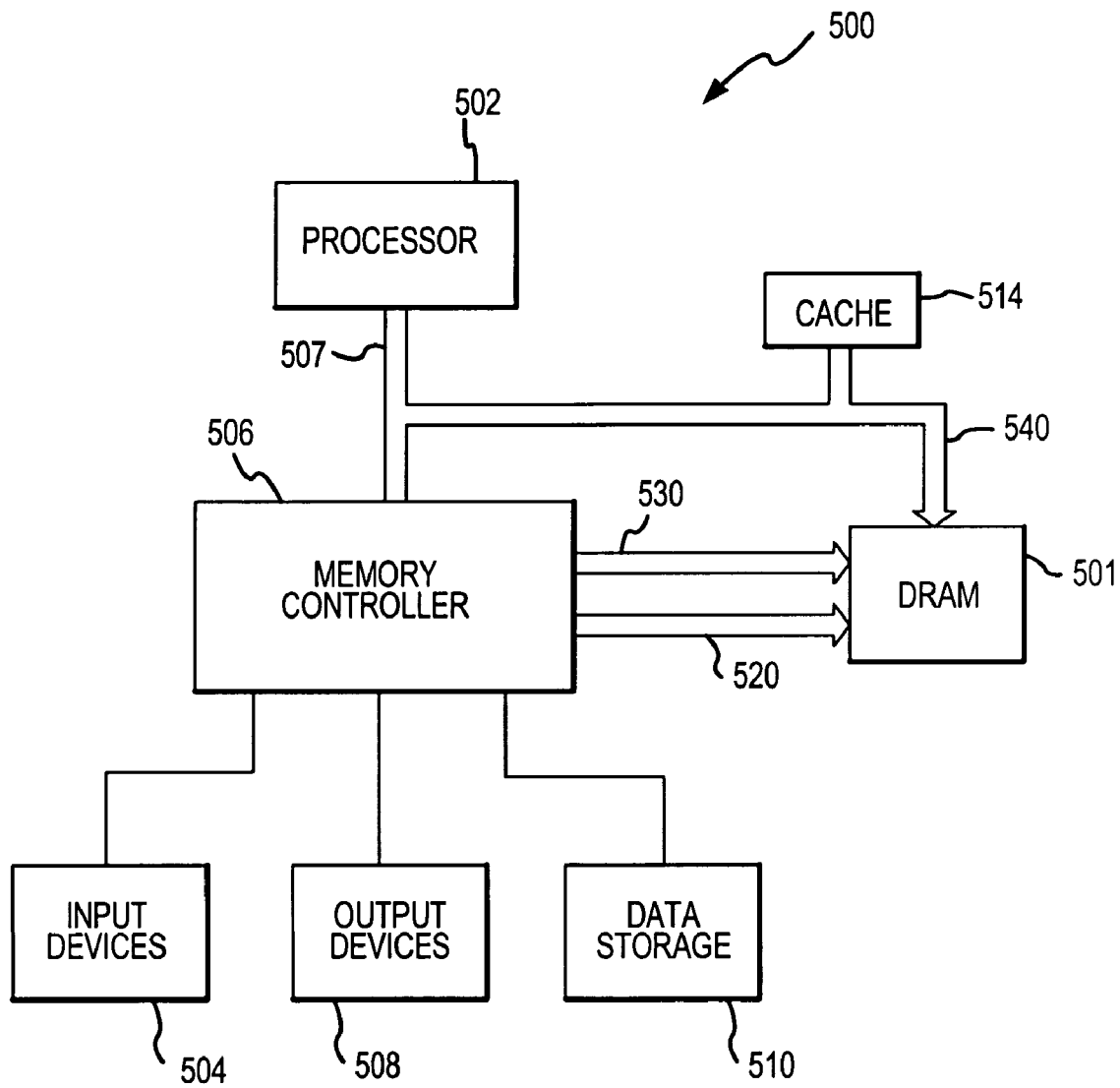
FIG. 4 is a block diagram of a computer system employing an embodiment of the present invention.

As shown in FIG. 4, a computer system 500 can take advantage of the present invention by incorporating DRAM devices 501 adapted with a preferred embodiment of the present invention as previously described. With reference to FIG. 4, a computer system 500 including the DRAM 501 includes a processor 502 for performing various functions, such as performing specific calculations or tasks. In addition, the computer system 500 includes one or more input devices 504, such as a keyboard or a mouse, coupled to the processor 502 through a memory controller 506 and a processor bus 507 to allow an operator to interface with the computer system 500. Typically, the computer system 500 also includes one or more output devices 508 coupled to the processor 502, such output devices typically being a printer or a video terminal. One or more data storage devices 510 are also typically coupled to the processor 502 through the memory controller 506 to store data or retrieve data from external storage media (not shown). Examples of typical data storage devices 510 include hard and floppy disks, tape cassettes, and compact disk read-only memories (CD-ROMs). The DRAM 501 is typically coupled to the memory controller 506 through the control bus 520 and the address bus 530. The data bus 540 of the DRAM 501 is coupled to the processor 502 either directly (as shown) or through the memory controller 506 to allow data to be written to and read from the DRAM 501. The computer system 500 may also include a cache memory 514 coupled to the processor 502 through the processor bus 507 to provide for the rapid storage and reading of data and/or instructions, as is well known in the art.

From the foregoing it will be appreciated that, although specific embodiments of the invention have been described herein for purposes of illustration, various modifications may be made without deviating from the spirit and scope of the invention. Just to name some examples, a designer may choose to apply an embodiment of the present invention which locks the DLL delay interval only upon entering a self-refresh mode, only upon receiving a chip deselect command, only upon receiving a series of NOP commands, or a combination of two of these. Similarly, a designer may choose only to lock the DLL delay interval but not disable the DLL clock. In addition, what situations might indicate that the DLL need not continue adjusting the DLL delay interval, or what constitutes a stable DLL delay interval, could be determined in other ways. Applying such embodiments of the present invention still saves power in preventing unnecessary switching of DLL delay devices in accordance with an objective of the present invention. Accordingly, the invention is not limited except as by the appended claims.

The invention claimed is:

1. A memory device, comprising:
   a memory array;
   a data access subsystem coupled to the memory array and operable to facilitate data communications between the memory and an external system;
   control logic receiving commands from the external system and coupled to the data access subsystem; and
   a delay circuitry coupled to the data access subsystem and operable to adjust a delay interval to synchronize a delayed clock signal with a system clock signal, the delay circuitry further operable to stop the synchronization and later resume the synchronization at a delay interval value arrived at before stoppage of the synchronization if synchronization of the delayed clock signal with the system clock signal will not be necessary and no command has been received for a predetermined time.

2. The memory device of claim 1 wherein synchronization of the delayed clock signal with the system clock signal will not be necessary when the memory device is directed to a self-refresh state.

3. The memory device of claim 1 wherein synchronization of the delayed clock signal with the system clock signal will not be necessary when the memory device is deselected.

4. The memory device of claim 1 wherein synchronization of the delayed clock signal with the system clock signal will not be necessary when a predetermined number of no operation signals has been received.

5. The memory device of claim 1 wherein the delay circuitry is further operable to stop generating the delayed clock signal if synchronization of the delayed clock signal with the system clock signal will not be necessary.

6. The memory device of claim 1 wherein the predetermined time comprises a period of time for voltage fluctuations caused by receipt of the command last received to have subsided.

7. The memory device of claim 1 wherein the memory device comprises a dynamic random access memory (DRAM) device.

8. A memory device, comprising:
   a memory array;
   a data access subsystem coupled to the memory array and operable to facilitate data communications between the memory array and an external system;
   control logic receiving commands from the external system and coupled to the data access subsystem;
   a delay circuit coupled to the data access subsystem and operable to adjust a delay interval to synchronize data communications between the data access system and the external system; and
   a delay circuit control coupled to the delay circuit, the delay circuit control operable to cause the delay circuit to later resume with the delay interval at a value adjusted to before the delay circuit is deactivated in response to receiving a first signal indicating data will not be read from or written to the memory array and a second signal indicating the memory device being in a predetermined state after receipt of a command last received.

9. The memory device of claim 8 wherein data will not be read from or written to the memory array when the memory device is directed to a self-refresh state.

10. The memory device of claim 8 wherein data will not be read from or written to the memory array when the memory device is deselected.

11. The memory device of claim 8 wherein data will not be read from or written to the memory array when a predetermined number of no operation commands has been received.

12. The memory device of claim 8 wherein the memory device is in the predetermined state upon passage of a predetermined period of time after the command last received was received.

13. The memory device of claim 8 wherein the memory device is in the predetermined state when voltage fluctuations caused by receipt of the command last received have subsided.

14. The memory device of claim 8 wherein the delay circuit control is further operable to cause generation of a delay circuit clock signal to stop in response to receiving the first and second signals.

15. An electronic device, comprising:
   an input device;
   an output device;

a data storage device;

a processor coupled to the input device, the output device, and the data storage device; and a memory device coupled to the processor, the memory device comprising:

a memory array;

a data access subsystem coupled to the memory array and operable to facilitate data communications between the memory array and other components of the electronic device;

control logic receiving commands and coupled to the data access subsystem; and a delay circuitry coupled to the data access subsystem and synchronizing a delayed clock signal with a system clock signal, the delay circuitry operable to stop synchronization of the clock signals and later resume synchronization with a delay interval reached before synchronization is stopped in response to receiving a first indication that synchronization of the clock signals will not be necessary and a second indication that the memory device is in a predetermined state subsequent to receipt of a command last received.

16. The electronic device of claim 15 wherein synchronization of the clock signals will not be necessary when the memory device is deselected.

17. The electronic device of claim 15 wherein synchronization of the clock signals will not be necessary when a predetermined number of no operation commands has been received.

18. The electronic device of claim 15 wherein the memory device is in the predetermined state upon passage of a predetermined period of time after the command last received was received.

19. The electronic device of claim 15 wherein the memory device is in the predetermined state when voltage fluctuations caused by receipt of the command last received have subsided.

20. A method for saving power in a delay locked loop associated with a device having a memory array, comprising:

determining whether or not keeping the delay locked loop activated will be necessary and whether or not the device is in a predetermined state following receipt of a command last received; and causing the delay locked loop to resume with a delay interval that is reached before the delay locked loop is deactivated when the delay locked loop is activated next time if keeping the delay locked loop activated will not be necessary and the device is in the predetermined state following receipt of the command last received.

21. The method of claim 20 wherein keeping the delay locked loop activated will not be necessary when the device is directed to place the memory array in a self-refresh state.

22. The method of claim 20 wherein keeping the delay locked loop activated will not be necessary when the device is deselected.

23. The method of claim 20 wherein keeping the delay locked loop activated will not be necessary when a predetermined number of no operation commands has been received.

24. The method of claim 20 wherein the device is in the predetermined state following receipt of the command last received upon passage of a predetermined period of time after the command last received was received.

25. The method of claim 20 wherein the device is in the predetermined state following receipt of the command last received after voltage fluctuations caused by receipt of the command last received have subsided.

* * * * *